United States Patent
Takeshima et al.

(10) Patent No.: US 6,856,223 B1
(45) Date of Patent: Feb. 15, 2005

(54) OPEN-TYPE MAGNET DEVICE FOR MRI

(75) Inventors: Hirotaka Takeshima, Ryugasaki (JP); Takao Honmei, Hitachinaka (JP); Hiroshi Tazaki, Kashiwa (JP); Kazuki Moritsu, Tokyo (JP); Shigenori Kuroda, Tokyo (JP); Hajime Tanabe, Tokyo (JP)

(73) Assignees: Hitachi Medical Corporation, Tokyo (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/070,998
(22) PCT Filed: Sep. 13, 2000
(86) PCT No.: PCT/JP00/06283
§ 371 (c)(1),
(2), (4) Date: May 21, 2002
(87) PCT Pub. No.: WO01/19242
PCT Pub. Date: Mar. 22, 2001

(30) Foreign Application Priority Data

Sep. 16, 1999 (JP) ............................................. 11-261367

(51) Int. Cl.$^7$ ................................................. G01V 3/00
(52) U.S. Cl. ........................ 335/301; 335/216; 324/320
(58) Field of Search ......................... 335/216, 296–306; 324/318–320

(56) References Cited

U.S. PATENT DOCUMENTS

| | | | | | |
|---|---|---|---|---|---|
| 5,389,909 | A | * | 2/1995 | Havens ....................... | 335/216 |
| 5,485,088 | A | * | 1/1996 | Westphal et al. ........... | 324/320 |
| 6,011,456 | A | * | 1/2000 | Eckels et al. ............... | 335/300 |
| 6,218,838 | B1 | * | 4/2001 | McGinley et al. .......... | 324/320 |
| 6,335,670 | B1 | * | 1/2002 | Kinanen ..................... | 335/296 |
| 6,580,346 | B1 | * | 6/2003 | Takeshima et al. ......... | 335/216 |

FOREIGN PATENT DOCUMENTS

| | | | |
|---|---|---|---|
| JP | A-7-250819 | | 10/1995 |
| JP | A-9-153408 | | 6/1997 |
| JP | A-9-190913 | | 7/1997 |
| JP | 9238913 | * | 9/1997 |

* cited by examiner

Primary Examiner—Ramon M. Barrera
(74) Attorney, Agent, or Firm—Antonelli, Terry, Stout & Kraus, LLP

(57) ABSTRACT

An open-type magnet device for MRI includes a pair of upper and lower magnet assemblies, and shims are provided on opposite sides of their cooling containers and/or in holes passing through central portions of the cooling containers so as to facilitate providing a highly homogeneous static magnetic field.

7 Claims, 7 Drawing Sheets

OPEN-TYPE MAGNET DEVICE FOR MRI

TECHNICAL FIELD

The present invention relates to an open-type magnet device to be used for MRI (magnetic resonance imaging) and in particular, to an open-type magnet device which can appropriately be used to obtain a highly-uniform static magnetic field.

BACKGROUND ART

In magnet device of horizontal magnetic field type or in a magnet device of vertical magnetic field type using a pole piece, a magnetic shim is used for improving uniformity of a static magnetic field generated by the magnet device.

However, in the magnet device of the vertical magnetic field type not using any pole piece, the uniformity of the static magnetic field generated by the magnet device has been improved by an adjusting coil provided in the magnet device.

DISCLOSURE OF INVENTION

It is therefore an object of the present invention to provide an open-type magnet device using a magnetic shim enabling to obtain a further highly-uniform magnetic fields and facilitating adjusting work for that.

Another object of the present invention is to provide an oper-type magnet device in which a space required for arranging a magnetic shim is reduced. As a result, it is possible to increase a space for a subject person or reduce the distance between upper and lower superconductive magnets arranged to oppose to each other, thereby improving the efficiency of superconductive magnets.

Still another object of the present invention is to provide an open-type magnet device in which the magnetic shim is arranged in a region assuring its magnetization linearlity, thereby facilitating optimalization of the magnetic shim position and enabling an effective magnetic field uniformity adjustment work.

The present invention uses an open-type superconductive magnet equipped with a magnetic shim (shims) which serves as means for adjusting magnetic field uniformity and is arranged in a pair of magnetic assemblies and more specifically, on an opposing surface side of a cooling vessel, i.e., a uniform static magnetic field space side.

As is described in JP-A-9-153408 and JP-A-9-190913, in a magnet assembly, a static magnetic field generating coil is composed of a main coil having a largest diameter arm an adjusting oil having a smaller diameter. These coils are arranged coaxially around a Z axis. In this configuration, magnetization of the magnetic shim in a region where the magnetic shim is arranged, i.e., magnetic vector direction is mostly vertical, i.e., Z direction in the vicinity of the cooling vessel center line (Z axis) and become vertical to the Z axis as the distance from the Z axis becomes greater. This means that in the vicinity of the Z axis, the magnetic shim is almost uniformly magnetized not depending on the position of the magnetic shim. That is, by arranging the magnetic shim in a region of a small radius from the center of the cooling vessel, it is possible to expect a constant magnetization. Accordingly, when calculating the position of the magnetic shim, there is no need of considering magnetization of the respective magnetic shims, thereby simplifying shimming work.

A region where the radius direction component of the shim magnetization is increased chances depending on a specific magnet assembly. However, when roughly observed, in a region of 0 to ⅔ of the main coil radius from the center, magnetization components are mostly Z-direction components.

However, even in a region having a greater radius, by actual measuring and computer simulation, it is possible to check the relationship between the position of the magnetic shim and its magnetization and to determine the position of the magnetic shim according to the calculated data. This is because the magnetic shim has a large magnetization change in the radius direction but a small magnetization change in a circumferential direction of a circle around the Z axis. That is, superconductive coils serving as the magnetic field generating source is made from a plurality of coaxial shapes and basically generates a magnetic field symmetric with respect to the axis. On the other hand, the magnetic shield provided at the coil outer circumference has a non-symmetric shape with respect to the Z axis because of the presence of a yoke and the like. This non-symmetric shape of the magnetic shield does not affect so much to the position of the magnetic shim introduced by the present invention. It has been confirmed that the magnetic shim is magnetized with identical components in any position in the circumferential direction. Accordingly, even when using an outer circumference portion having a large radius direction component, it is often sufficient to consider shim magnetization change amount depending on the position in the radius direction. Furthermore, when a high uniformity of a magnetic field is required, it is sufficient to fetch a shim magnetization change in the circumferential direction by data interpolation according to the uniformity degree.

In the open-type superconductive magnet disclosed in the aforementioned JP-A-9-153408 and JP-A-9-190913, it has been confirmed that by arranging the magnetic shim on the opposing surface of the cooling vessel, it is possible to adjust the magnetic field uniformity. Moreover, a position where the magnetic shim is actually arranged may be other than the uniform static magnetic field space side of the cooling vessel, such as the uniform static magnetic field space side of the gradient magnetic field coil. In case the gradient magnetic field coil is magnetically shielded, the shim may be arranged between the main gradient magnetic field coil and the gradient magnetic field shield coil or/and at the uniform magnetic field space side of the main gradient magnetic field coil.

According to the present invention, it is possible to obtain an open-type magnet device in which magnetic field adjusting means is provided at the opposing surfaces of cooling vessels sandwiching an uniform static magnetic field space region constituting an upper and a lower magnet assemblies, which enables to further improve uniformity of the static magnetic field formed therebetween.

BEST MODE FOR CARRYING OUT THE INVENTION

Description will now be directed to an embodiment of the present invention wish reference to FIG. 1, FIG. 2, FIG. 3, and FIG. 4.

Figure 1:
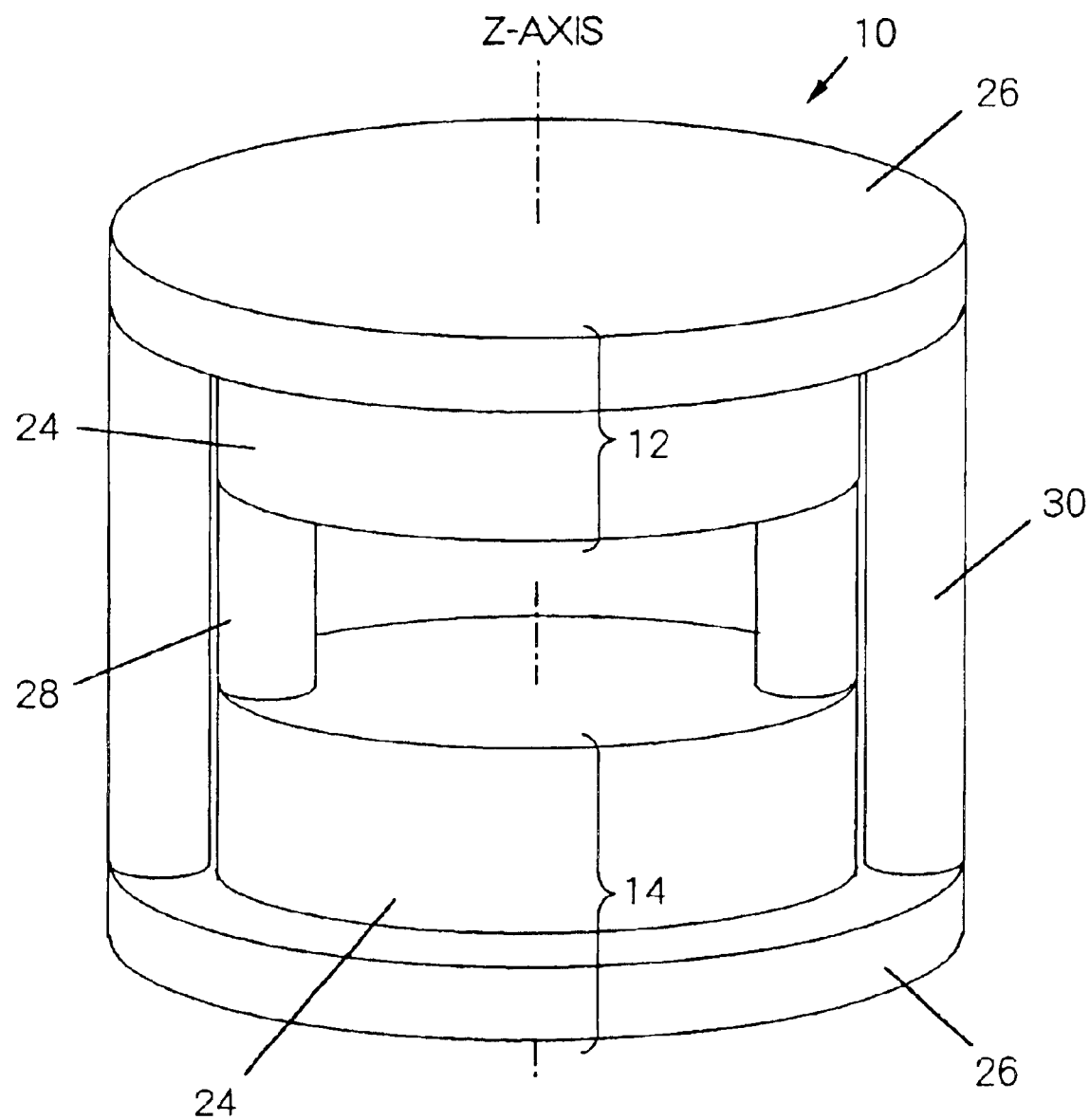
FIG. 1 schematically shows an external perspective view of an open-type magnet device according to the present invention.
Figure 2:
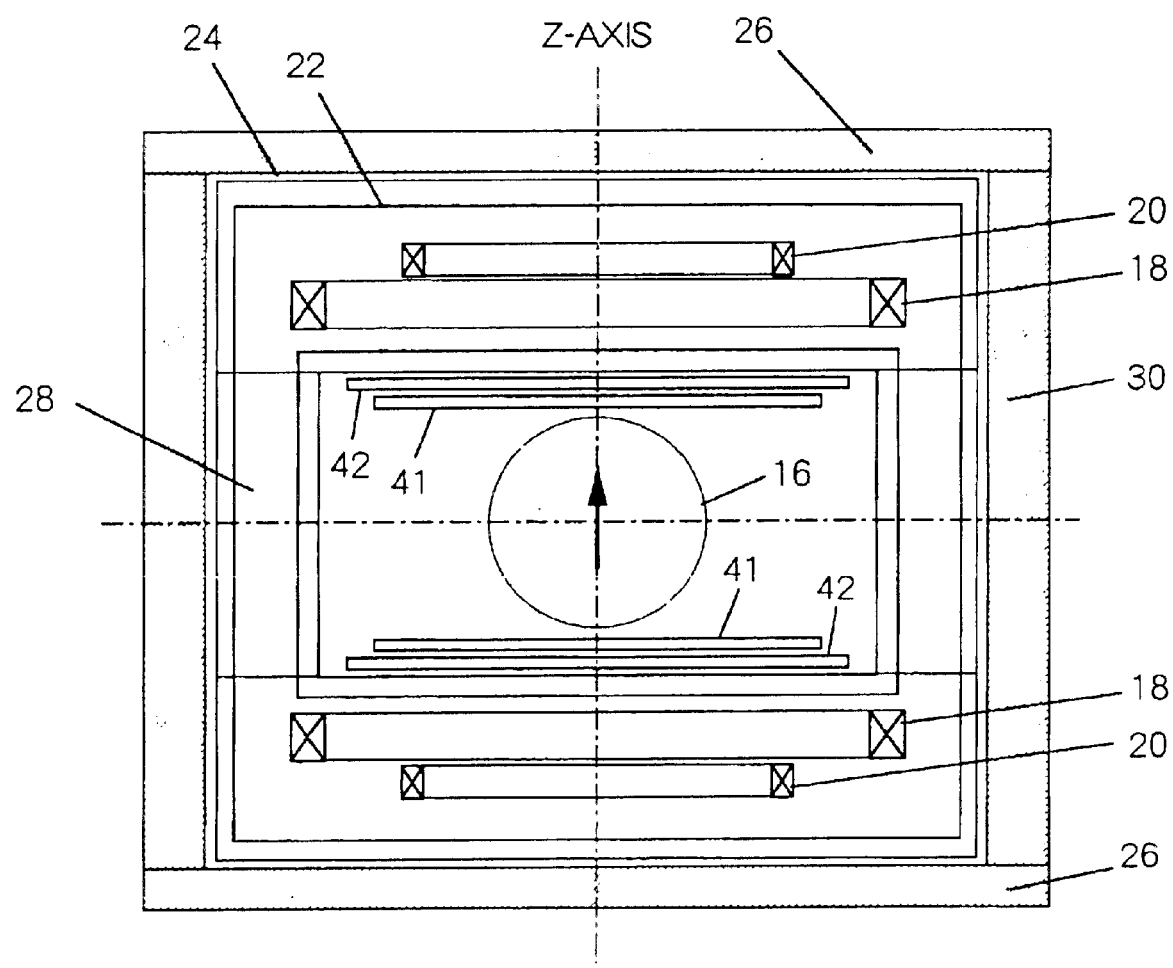
FIG. 2 is longitudinal cross sectional view of the open-type magnet device of FIG. 1.

As shown in FIG. 1 and FIG. 2, an open-type magnet device 10 has a pair of an upper magnet assembly 12 and a lower magnet assembly 14 which oppose to each other. Each of the upper and lower magnet assemblies 12 and 14 includes: a main superconductive coil 18 for generating a uniform static magnetic field space 16 therebetween; an adjusting superconductive coil 20 for adjusting uniformity of a static magnetic field generated by the main superconductive coil 18; a coolant vessel 22 containing a coolant for cooling the main superconductive coil 18 and the adjusting superconductive coil 20 to a temperature of the super conductivity or below and containing the superconductive coils; a vacuum vessel 24 made from a non-magnetic material such as aluminum and stainless steel and entirely covering the coolant vessel 22 so as to prevent heat convection; the coolant vessel 22 and the vacuum vessel 24 constituting a cooling vessel; and a ferromagnetic plate 26 covering the outside of the cooling vessel so as suppress leak magnetic flux from the superconductive coils. The superconductive coils 18 and 20 are arranged coaxially around a Z-axis as a center. The coolant vessel 22 and the vacuum vessel 24 of each of the upper and lower magnet assemblies 12 and 14 are connected to each other by a connection tube 28. The upper and lower ferromagnetic plates 26 are supported by a yoke 30 and magnetically connected. A reference symbol 41 denotes a main gradient magnetic coil and 42 denotes a shield gradient magnetic field coil.

Figure 3:
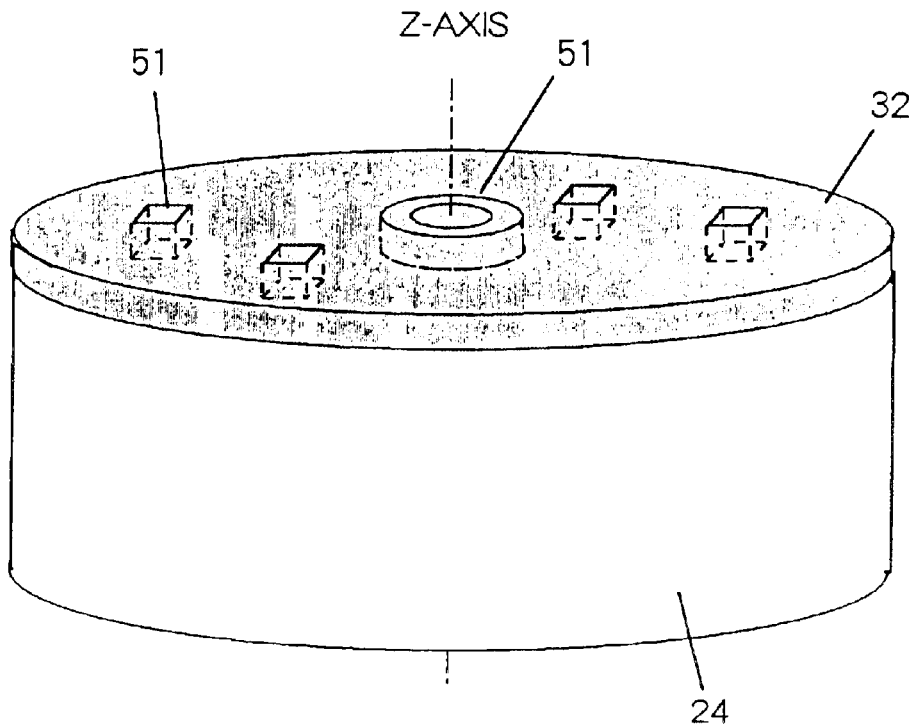
FIG. 3 is a perspective view showing arrangement of magnetic shims according to an embodiment of the present invention.
Figure 4:
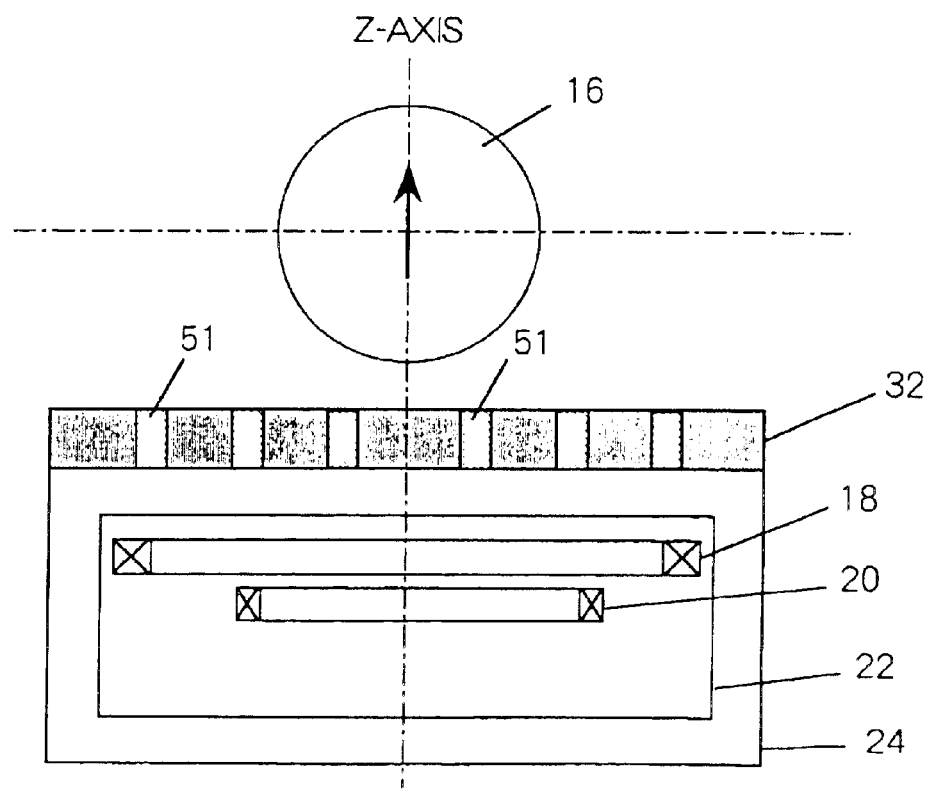
FIG. 4 is a longitudinal cross sectional view of FIG. 3.

Furthermore, as shown in FIG. 3 and FIG. 4, one or more than one magnetic shim 51 is arranged in the opposing planes of the vacuum vessel 24 serving as a cooling vessel of the upper and lower magnet assemblies 12 and 14. FIG. 3 shows the lower magnet assemblies 14.

A specific shape of the magnetic shims 51 arranged in this region, for example, may be a cube of 10 mm×10 mm×10 mm or a ring shape centered at the Z-axis.

Moreover, the magnetic shims may be made from, for example, known soft magnetic material such as iron, silicon steel, permalloy, and the like.

Figure 5:
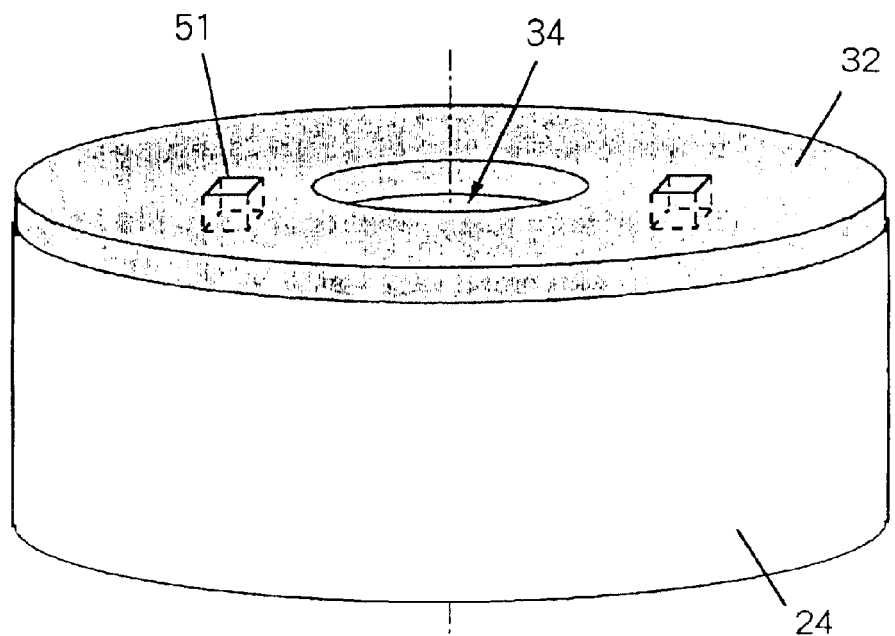
FIG. 5 is a perspective view showing arrangement of magnetic shims according to another embodiment of the present invention.
Figure 6:
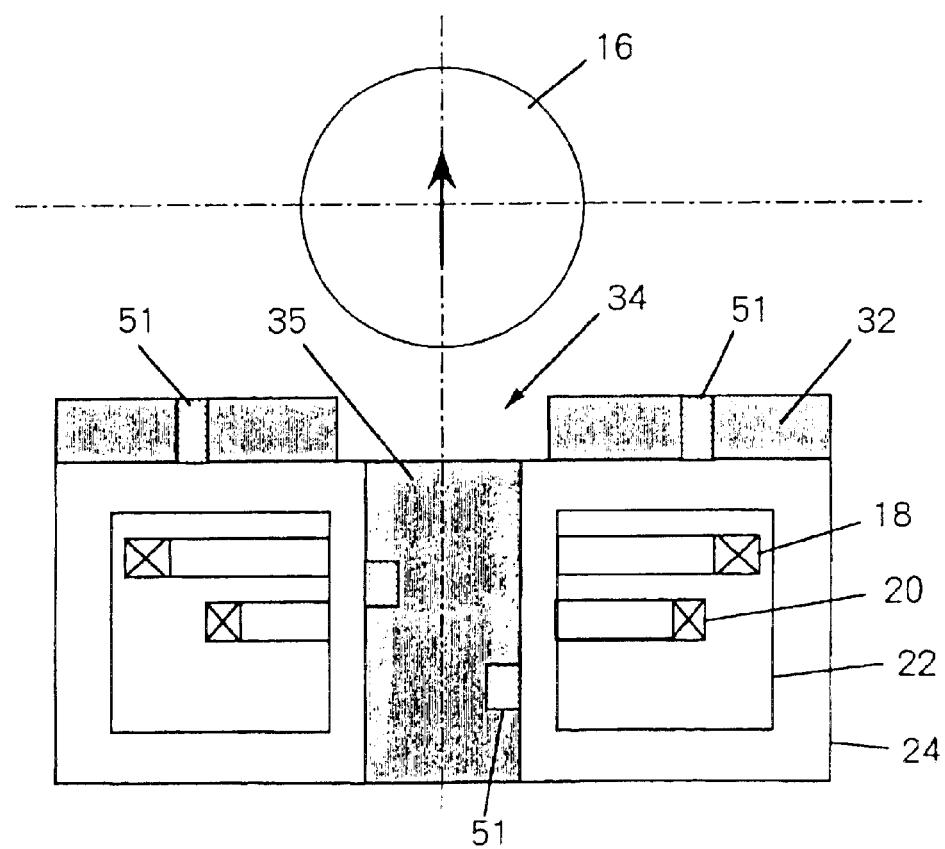
FIG. 6 is a longitudinal cross sectional view of FIG. 5.

FIG. 5 and FIG. 6 show another embodiment of the present invention. In this embodiment, the vacuum vessel 24 serving as a cooling vessel is made in a doughnut shape having a through hole 34 at the center portion thereof, ard the magnetic shim 51 is arranged in an opposing surface 32 or/and a region 35 of a through hole. That is, in addition to, the region 32 shown in FIG. 4, the magnetic shim is arranged in a center hole portion 35, i.e., on a wall of this portion and a support member.

This center hole portion 35 is in the vicinity of the center axis of the superconductive coil and accordingly, in general, the magnetic field distribution becomes almost uniform. Therefore, not depending on the position of the magnetic shim 51, shim magnetization is constant. This facilitates optimal arrangement performed upon shimming. Thus, a range of shim positions for adjusting the magnetic field uniformity is increased by using the magnetic shim in the enter hole 34 in addition to the magnetic shims arranged on the opposing surface of the cooling vessel. This simplifies adjustment of the magnetic field uniformity.

Moreover, since the magnetic shim can be located at a position difference in distance in the Z direction from the uniform magnetic field, a wider selection range can be obtained for selecting a ratio between various magnetic field components, if expressed in spherical harmonics function generated by the magnetic shimming, such as coefficients of each of terms of first degree, second degree, third degree . . . . This facilitates approach of coefficients of the first degree and above to zero. This enables to cope with various changes of the ratio of the magnetic components to be controlled.

Moreover, for a component adjustable by magnetic shims arranged on the opposing surface of the cooling vessel, use of the shim in the center hole can reduce the shim amount on the opposing surface. Thus can reduce the space of the region on the opposing surface where shims are arranged, which in turn can increase a uniform magnetic space into which a examined sample is inserted. Alternatively, this can reduce the opposing distance between the superconductive magnets and accordingly, can improve the magnetic field generation efficiency of the magnet, which in turn can reduce the entire size of the magnet device.

It should be noted that JP-A-7-250819 also discloses a configuration in which a magnetic shim is arranged along an inner surface of a center hole provided in a cooling vessel. However, this center hole is configured so as to receive a subject person and accordingly, the shim can be arranged only on a surface portion along the inner circumference. Accordingly, the ability of the uniformity adjustment is also limited. On the other hand, the present invention assumes a magnet in which a subject person is not positioned in the center hole and the magnetic shim arrangement is not limited to a particular position of the center hole, thereby enabling to obtain uniformity adjustment of a wider range.

Figure 7:
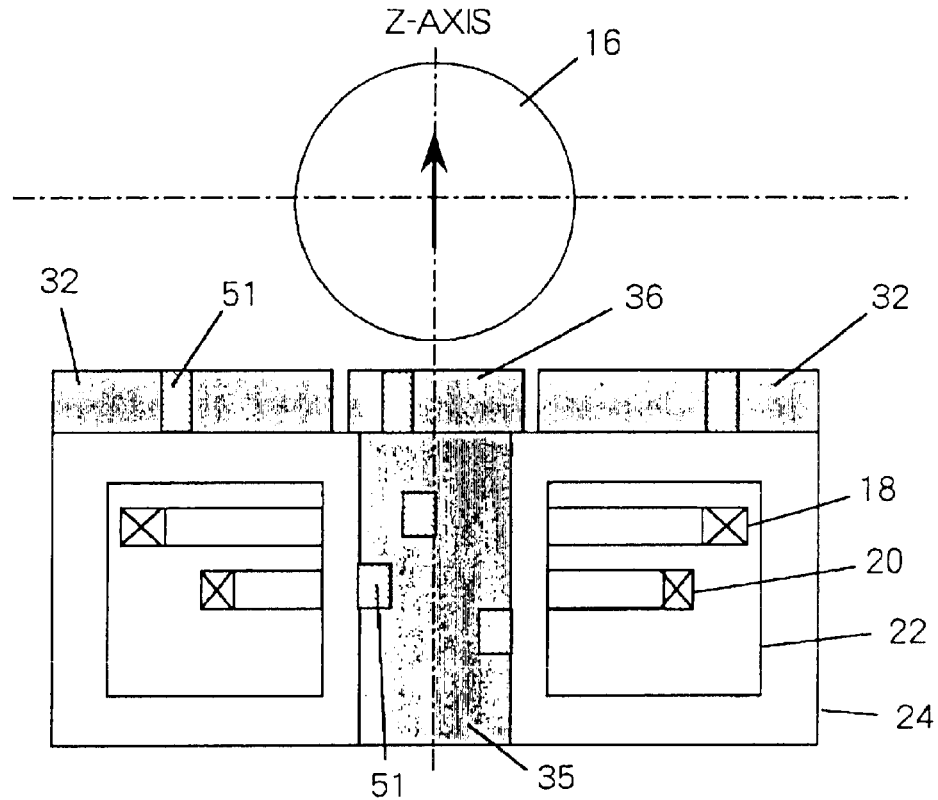
FIG. 7 is a perspective view showing arrangement of magnetic shims according to still another embodiment of the present invention.

FIG. 7 shows still another embodiment of the present invention.

In the embodiment of FIG. 5 and FIG. 6, the shims on the opposing surface are not located at the center portion so as not to disturb mounting of the center hole shim.

In contrast to this, in the embodiment of FIG. 7, in order to effectively use the center portion of the opposing surface, a magnetic shim region 36 is also provided in this center portion. The magnetic shim 51 in this region is attached to a non-magnetic mounting jig and arranged at least detachably. For attaching/removing the center shim, what is necessary is only to remove the center portion of the opposing surface. Therefore, working ability is not deteriorated.

Figure 8:
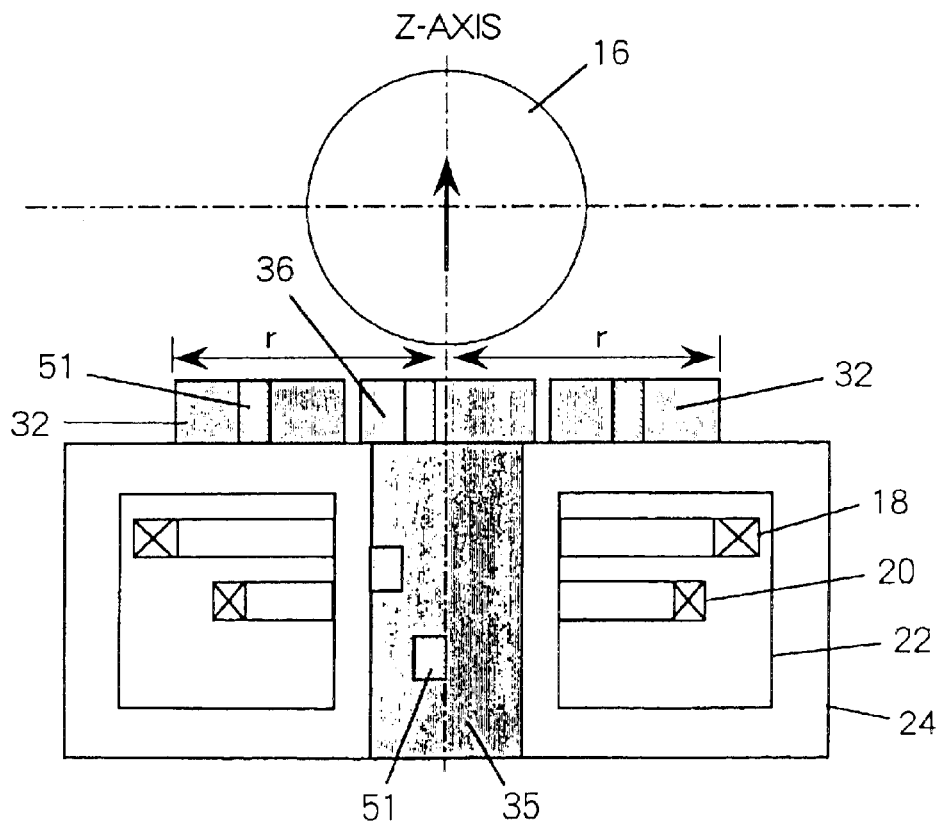
FIG. 8 is a perspective view showing arrangement of magnetic shims according to yet another embodiment of the present invention.

FIG. 8 shows yet another embodiment of the present invention.

In this embodiment, the shim region of the opposing surface is limited to a constant radius r from the center. In the region at a smaller radius direction distance from the center, main component of magnetization in the magnetic shim arrangement regions 32, 35, 36 is Z component. Accordingly, magnetization of magnetic members becomes uniform and the shims can be arranged optimally. Moreover, work results coincide calculated values and it is possible to reduce the number of shimming processes.

The radius limit can be selected to obtain a range in which magnetization has a main component in Z direction. This range is optimal when 0 to $2/3$ of a diameter of the main superconductive coil. In general, the dimension from the inner wall of the outer circumference of the coolant vessel 22 to the outermost circumference of the vacuum vessel 24 is 60 mm, to 150 mm. On the other hand, when considering an MRI system for an entire body of a person, the main superconductive coil preferably has radius of 700 to 1000 mm. On the other hard, in order to minimize the outer dimension of the magnet, the outermost circumference of the main superconductive coil is arranged in the vicinity of the inner wall of the outer circumference of the coolant vessel 22. Moreover, the vacuum vessel 24 is also made as small as possible in a range where the heat intrusion into the coolant vessel 22 is not greater than a predetermined value.

Accordingly, the radius limit is about $2/3$ of the cooling vessel, i.e., the outer diameter of the vacuum vessel 24.

Figure 9:
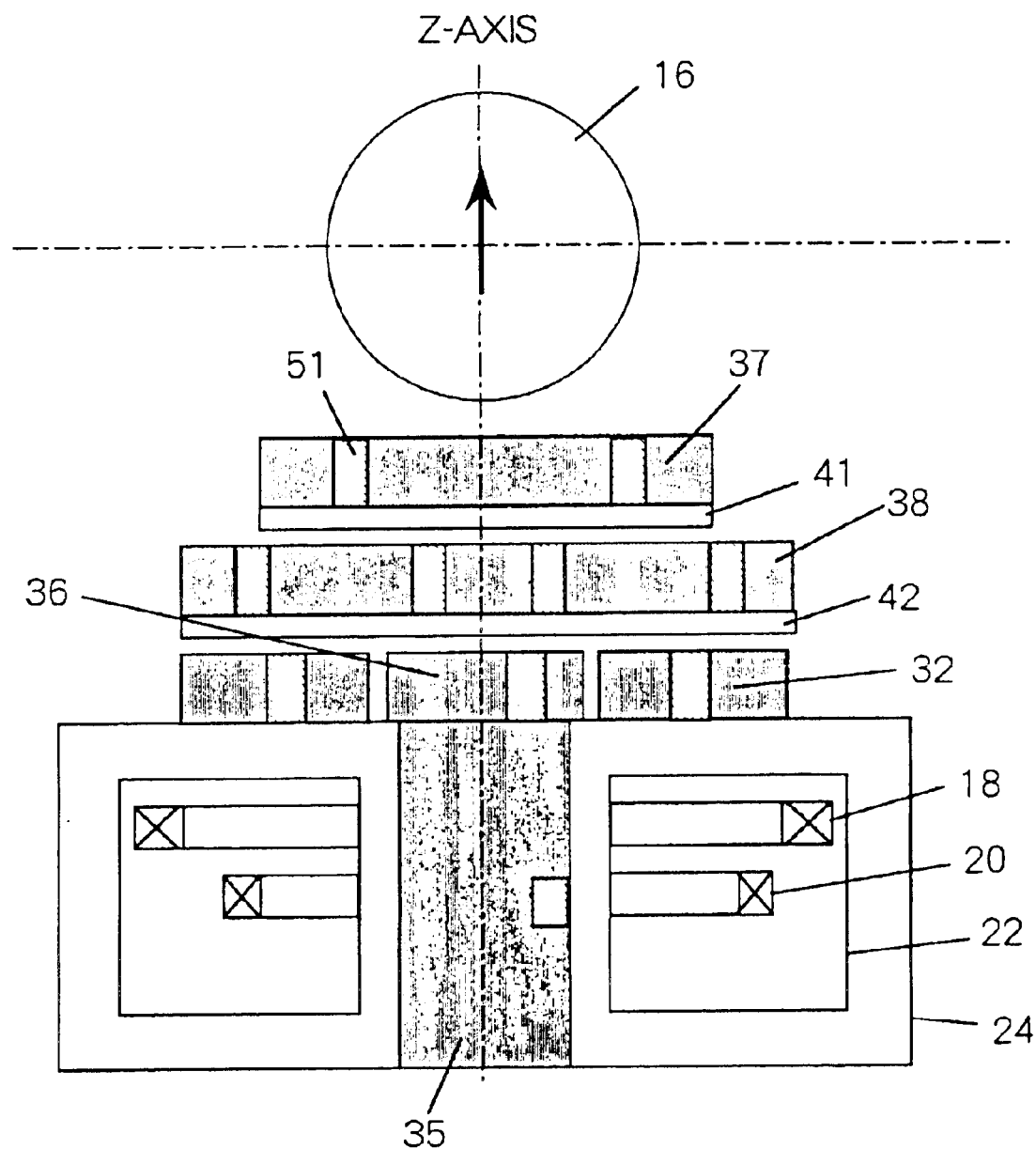
FIG. 9 is a perspective view showing arrangement of magnetic shims according to yet still another embodiment of the present invention.

FIG. 9 shows yet another embodiment of the present invention.

FIG. 9 shows an example where, in addition to the regions 32, 35, and 36 of FIG. 8, the magnetic shims 51 are also arranged in a region 37 of the uniform static magnetic field space side of the main gradient magnetic field coil 41 and a region between the main gradient magnetic field coil 41 and the main shield gradient magnetic field coil 42.

The magnetic shims need not be arranged in all of the regions 32, 35, 36, 37 and 38 but can be arranged at least one of the regions, so as to adjust uniformity of the magnetic field.

Figure 10:
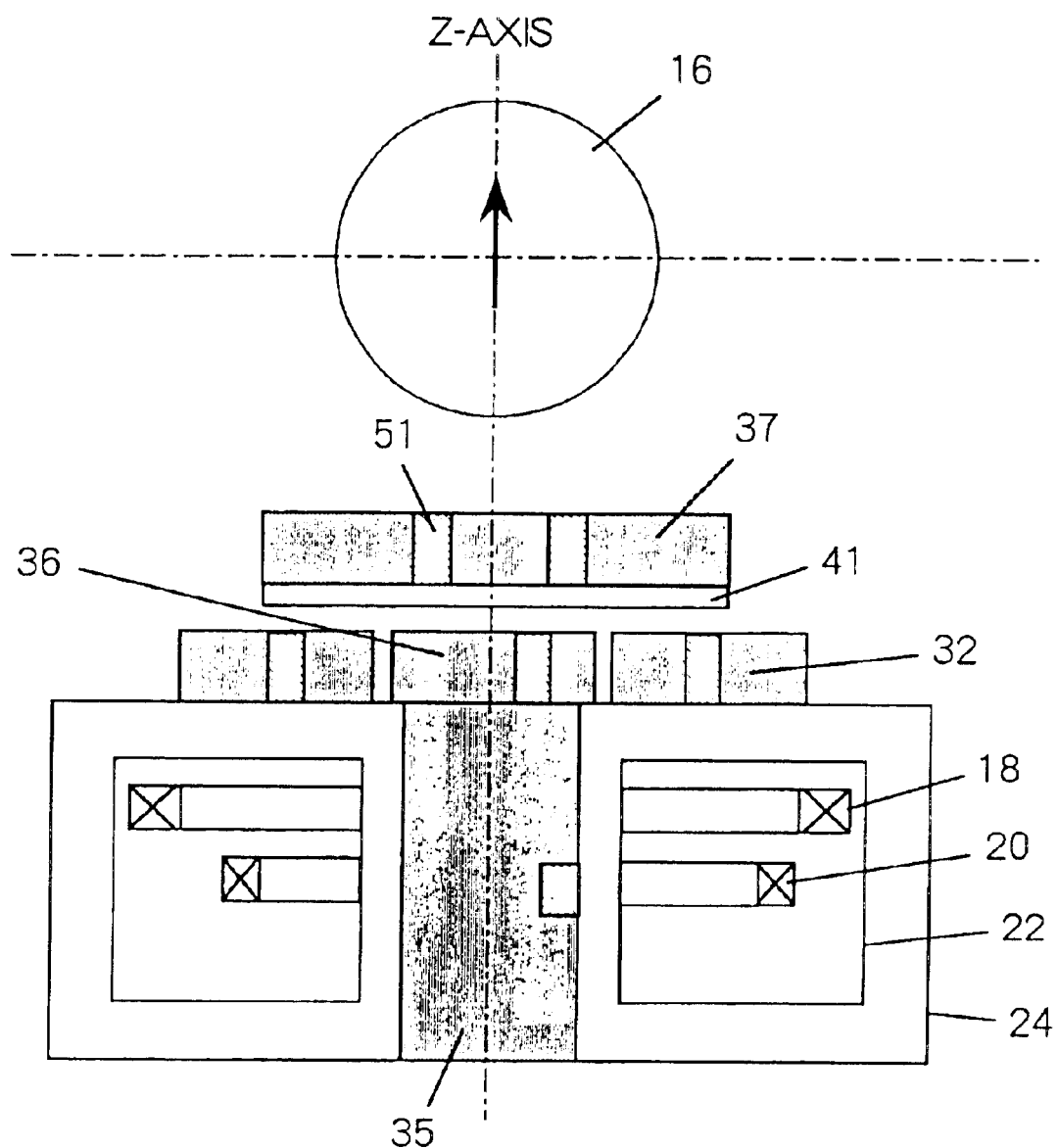
FIG. 10 is a perspective view showing arrangement of magnetic shims according to yet another embodiment of the present invention.

FIG. 10 shows still another embodiment of the present invention in which the gradient magnetic field coil is not shielded. In this case, the shield gradient magnetic coil 42 is not used and only the main gradient magnetic field coil 41 exists. In this case, in addition to the regions 32, 35, and 36, the region 37 of the uniform static magnetic field space side of the main gradient magnetic field coil 41 becomes a candidate as a region where the magnetic shim is arranged. In this case also, the magnetic shim may be provided at one or more than one of the regions 32, 35, 36, and 37 for adjusting uniformity of the magnetic field.

While FIG. 9 and FIG. 10 show examples in combination with FIG. 8, they can also be used in combination of embodiments of FIG. 4, FIG. 6, and FIG. 7. In these cases also, the magnetic shim may be provided at one or more than one of the regions 32, 35, 36, 37 and 38 for adjusting uniformity of the magnetic field.

In each of the embodiments of FIG. 4, FIG. 6, FIG. 7, and FIG. 8 also, the magnetic shim is arranged in one or more than one regions 32, 35, and 36 so as to adjust uniformity of the magnetic field.

In FIG. 4, FIG. 6, and FIG. 7 to FIG. 10, explanation has been given on arrangement of the magnetic shims in the magnet assembly 14. Identical shim arrangement regions are also provided in the magnet assembly 12 and the magnetic shims are arranged in these regions for adjusting uniformity of the magnetic field.

The present invention can also be applied to an MRI apparatus using a resistive magnet. In this case, the MRI apparatus has configuration as follows.

An open-type magnet device comprising:

a pair of upper and lower magnetic field generating coils arranged to oppose each other so as to generate a uniform static magnetic field in a region which covers a test portion of a subject person;

a container for containing each of the magnetic field generating coils; and at least one magnetic shim arranged at the uniform static magnetic field space region side of the respective containers and serving to further adjust magnetic field uniformity of the uniform static magnetic field space region.

(2) The open-type magnet device for MRI according to (1), wherein the containers are doughnut-shaped having a through hole in the center portion and the magnetic shim is arranged at a predetermined position in the through hole.

(3) The open-type magnet device for MRI according to (1), wherein a gradient magnetic field coil is arranged at the uniform static magnetic field space region side of each of the containers and the magnetic shim is arranged at the uniform static magnetic field space region side of the gradient magnetic field coil.

The present invention is not limited to the aforementioned embodiments but may be modified in various way within the scope of claims.

INDUSTRIAL APPLICABILITY

The present invention can be applied not only an MRI apparatus using a superconducting magnet device or static magnetic field generating coil but also to an MRI apparatus using a permanent magnet device.

What is claimed is:

1. An open-type magnet device for MRI, comprising:

a pair of an upper and a lower magnet assemblies which are arranged to oppose to each other so as to generate a uniform static magnetic field in a space region which covers a test portion of a subject, and each of which includes: a main superconductive coil for generating a uniform static magnetic field therebetween and an adjusting superconductive coil for adjusting magnetic field uniformity of the uniform static magnetic field;

a cooling vessel containing the main superconductive coil and the adjusting superconductive coil for maintaining a superconductive state; and magnetic field adjusting means arranged at the uniform static magnetic field space side of the cooling vessel, so as to further adjust the magnetic field uniformity of the uniform static magnetic field space region;

wherein the cooling vessel is a doughnut-shaped cooling vessel having a through hole in a center portion thereof and the magnetic field adjusting means is arranged at a predetermined position of the through hole; and the magnetic field adjusting means is also arranged to the side of the uniform static magnetic field space and outside the through hole.

2. An open-type magnet device for MRI, comprising:

a pair of an upper and a lower magnet assemblies which are arranged to oppose to each other so as to generate a uniform static magnetic field in a space region which covers a test portion of a subject, and each of which includes: a main superconductive coil for generating a uniform static magnetic field therebetween and an adjusting superconductive coil for adjusting magnetic field uniformity of the uniform static magnetic field;

a cooling vessel containing the main superconductive coil and the adjusting superconductive coil for maintaining a superconductive state; and magnetic field adjusting means arranged at the uniform static magnetic field space side of the cooling vessel, so as to further adjust the magnetic field uniformity of the uniform static magnetic field space region;

wherein the cooling vessel is a cylinder-shaped or a doughnut-shaped cooling vessel having a through hole in a center portion thereof and the magnetic field adjusting means is arranged in a region range of 2R/3 wherein R represents a radius of the opposing surface of the cooling vessel.

3. An open-type magnet device for MRI, comprising:

a pair of an upper and a lower magnet assemblies which are arranged to oppose to each other so as to generate a uniform static magnetic field in a space region which covers a test portion of a subject and each of which includes: a main superconductive coil for generating a uniform static magnetic field therebetween and an adjusting superconductive coil for adjusting magnetic field uniformity of the uniform static magnetic field;

a doughnut-shaped cooling vessel having a through hole in a center portion thereof and containing the main superconductive coil and adjusting superconductive coil for maintaining a superconductive state; and magnetic field adjusting means arranged at a predetermined position in the through hole of the cooling vessel, so as to further adjust magnetic field uniformity of the uniform static magnetic field space region;

wherein the magnetic field adjusting means is also arranged to the side of the uniform static magnetic field space and outside the through hole.

4. The open-type magnet device for MRI as claimed in claim 3, comprising at least one additional magnetic field adjusting means arranged between the uniform static magnetic field space and the cooling vessel.

5. The open-type magnet device for MRI as claimed in claim 3, wherein at least one of the magnetic field adjusting means is also arranged along a cooling vessel side-wall which faces a central longitudinal axis of the through hole of the cooling vessel.

6. The open-type magnet device for MRI as claimed in claim 3, comprising additional ones of the magnetic field adjusting means provided on differing layers arranged between the uniform static magnetic field space and the cooling vessel.

7. The open-type magnet device for MRI as claimed in claim 3, wherein at least one of the magnetic field means is detachably attached to the inside or outside of the through hole.

* * * * *

UNITED STATES PATENT AND TRADEMARK OFFICE
CERTIFICATE OF CORRECTION

PATENT NO. : 6,856,223 B1
DATED : February 15, 2005
INVENTOR(S) : Takeshima et al.

It is certified that error appears in the above-identified patent and that said Letters Patent is hereby corrected as shown below:

Column 1,
Line 28, delete "oper-type" and change to -- open-type --;
Line 50, delete "oil" and change to -- coil --; and
Line 67, delete "chances" and change to -- changes --.

Column 2,
Line 33, delete "afcrementioned" and change to -- aforementioned --.

Signed and Sealed this

Twenty-eighth Day of March, 2006

JON W. DUDAS
*Director of the United States Patent and Trademark Office*